United States Patent
Hiyoshi et al.

(10) Patent No.: US 9,691,859 B2
(45) Date of Patent: Jun. 27, 2017

(54) SILICON CARBIDE SEMICONDUCTOR DEVICE

(71) Applicant: Sumitomo Electric Industries, Ltd., Osaka-shi (JP)

(72) Inventors: Toru Hiyoshi, Osaka (JP); Keiji Wada, Osaka (JP); Takeyoshi Masuda, Osaka (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 0 days.

(21) Appl. No.: 15/021,230

(22) PCT Filed: Jul. 28, 2014

(86) PCT No.: PCT/JP2014/069796
§ 371 (c)(1),
(2) Date: Mar. 10, 2016

(87) PCT Pub. No.: WO2015/037347
PCT Pub. Date: Mar. 19, 2015

(65) Prior Publication Data
US 2016/0225855 A1 Aug. 4, 2016

(30) Foreign Application Priority Data
Sep. 12, 2013 (JP) .................................. 2013-189573

(51) Int. Cl.
*H01L 29/15* (2006.01)
*H01L 29/16* (2006.01)
(Continued)

(52) U.S. Cl.
CPC ...... *H01L 29/1608* (2013.01); *H01L 29/0619* (2013.01); *H01L 29/1095* (2013.01);
(Continued)

(58) Field of Classification Search
CPC . H01L 29/47; H01L 29/1608; H01L 29/0495; H01L 29/872; H01L 29/1095;
(Continued)

(56) References Cited

U.S. PATENT DOCUMENTS

2015/0115286 A1* 4/2015 Takeuchi ............ H01L 21/8213
257/77
2016/0079411 A1* 3/2016 Hino ........................ H01L 29/47
257/77

FOREIGN PATENT DOCUMENTS

JP 2001-094095 A 4/2001
JP 2003-229570 A 8/2003
(Continued)

OTHER PUBLICATIONS

International Search Report in PCT International Application No. PCT/JP2014/069796, dated Nov. 4, 2014.

*Primary Examiner* — Trung Q Dang
(74) *Attorney, Agent, or Firm* — Venable LLP; Michael A. Sartori; Laura G. Remus

(57) ABSTRACT

There is provided a silicon carbide semiconductor device allowing for integration of a transistor element and a Schottky barrier diode while avoiding reduction of an active region and decrease of a breakdown voltage. A silicon carbide semiconductor device includes a silicon carbide layer. The silicon carbide layer includes: a first region defining an outer circumference portion of an element region in which a transistor element is provided; and a JTE region provided external to the first region in a drift layer and electrically connected to the first region. The first region is provided with at least one opening through which the drift layer is exposed. The silicon carbide semiconductor device further includes a Schottky electrode provided in the opening and forming a Schottky junction with the drift layer.

7 Claims, 14 Drawing Sheets

(51) Int. Cl.
  *H01L 29/872* (2006.01)
  *H01L 29/78* (2006.01)
  *H01L 29/10* (2006.01)
  *H01L 29/06* (2006.01)
  *H01L 29/739* (2006.01)

(52) U.S. Cl.
  CPC ...... *H01L 29/7806* (2013.01); *H01L 29/7811* (2013.01); *H01L 29/7813* (2013.01); *H01L 29/872* (2013.01); *H01L 29/0615* (2013.01); *H01L 29/0623* (2013.01); *H01L 29/0696* (2013.01); *H01L 29/7395* (2013.01)

(58) Field of Classification Search
  CPC ............. H01L 29/7806; H01L 29/7395; H01L 29/7813; H01L 29/0619; H01L 29/7811
  USPC ......................................................... 257/77
  See application file for complete search history.

(56) References Cited

FOREIGN PATENT DOCUMENTS

| | | |
|---|---|---|
| JP | 2009-088326 A | 4/2009 |
| JP | 2009-194127 A | 8/2009 |
| JP | 2010-225615 A | 10/2010 |

\* cited by examiner

SILICON CARBIDE SEMICONDUCTOR DEVICE

TECHNICAL FIELD

The present invention relates to a silicon carbide semiconductor device. More particularly, the present invention relates to a silicon carbide semiconductor device including a transistor element and a Schottky barrier diode.

BACKGROUND ART

In recent years, silicon carbide (SiC) has begun to be employed as a material of a semiconductor device. As a semiconductor device employing a silicon carbide substrate, there has been proposed a semiconductor device in which a transistor element and a Schottky barrier diode (hereinafter, also referred to as "SBD") are integrated.

For example, according to Japanese Patent Laying-Open No. 2009-194127 (Patent Document 1), a silicon carbide semiconductor device has a DMOSFET region and an SBD region. The SBD region is a region different from the DMOSFET region. For example, according to Japanese Patent Laying-Open No. 2003-229570 (Patent Document 2), the SBD is constituted of: a portion of a drain region of the field effect transistor not covered with a gate insulating film; and a metal. For example, according to Japanese Patent Laying-Open No. 2009-88326 (Patent Document 3), the SBD is formed between two cells of a MOSFET.

CITATION LIST

Patent Document

PTD 1: Japanese Patent Laying-Open No. 2009-194127
PTD 2: Japanese Patent Laying-Open No. 2003-229570
PTD 3: Japanese Patent Laying-Open No. 2009-88326

SUMMARY OF INVENTION

Technical Problem

Japanese Patent Laying-Open No. 2009-194127 does not specifically disclose the position of the SBD region in the semiconductor device. Generally, a semiconductor device is implemented in the form of a semiconductor chip. By providing both the SBD region and the DMOSFET region in the semiconductor device, the area of the semiconductor chip is increased, disadvantageously.

Further, it is considered that a region for securing a breakdown voltage of the DMOSFET is provided at a region (for example, a vicinity of the outer circumference portion of the DMOSFET region) different from the DMOSFET region. In such a case, the SBD needs to be provided such that an influence over the breakdown voltage of the DMOSFET becomes as small as possible. However, Japanese Patent Laying-Open No. 2009-194127 does not disclose a structure near a boundary between the DMOSFET region and the SBD region. Thus, Japanese Patent Laying-Open No. 2009-194127 does not disclose necessity of taking the above problem into consideration.

On the other hand, according to Japanese Patent Laying-Open No. 2003-229570, the SBD is incorporated with a transistor cell. Accordingly, the size of the transistor cell becomes large. According to Japanese Patent Laying-Open No. 2003-229570, the SBD is provided between a plurality of transistor cells. Accordingly, a space between the plurality of transistor cells becomes large. These configurations cause decrease of the area of an active region of the MOSFET, i.e., a region contributing to flow of a current in the MOSFET. In other words, the area of the semiconductor chip necessary for flow of a certain magnitude of current is increased.

The present invention has an object to provide a silicon carbide semiconductor device allowing for integration of a transistor element and a Schottky barrier diode while avoiding reduction of an active region and decrease of a breakdown voltage.

Solution to Problem

A silicon carbide semiconductor device according to one aspect of the present invention includes a silicon carbide layer having a first main surface and a second main surface opposite to the first main surface. The silicon carbide layer includes: a drift layer having first conductivity type and defining the first main surface of the silicon carbide layer; a first region provided in the drift layer, the first region having second conductivity type different from the first conductivity type, the first region defining an outer circumference portion of an element region in which a transistor element is provided; and a second region provided external to the first region in the drift layer, the second region having the second conductivity type, the second region being electrically connected to the first region. The first region is provided with at least one opening through which the drift layer is exposed. The silicon carbide semiconductor device further includes a Schottky electrode provided in the opening and forming a Schottky junction with the drift layer.

Advantageous Effects of Invention

According to the present invention, there can be provided a silicon carbide semiconductor device allowing for integration of a transistor element and a Schottky barrier diode while avoiding reduction of an active region and decrease of a breakdown voltage.

BRIEF DESCRIPTION OF DRAWINGS

FIG. 5 is a schematic plan view of a silicon carbide layer 10 for illustrating the positions of openings 30a.

FIG. 6 is a partial enlarged view of a body region 13a for illustrating openings 30a.

DESCRIPTION OF EMBODIMENTS

Figure 1:
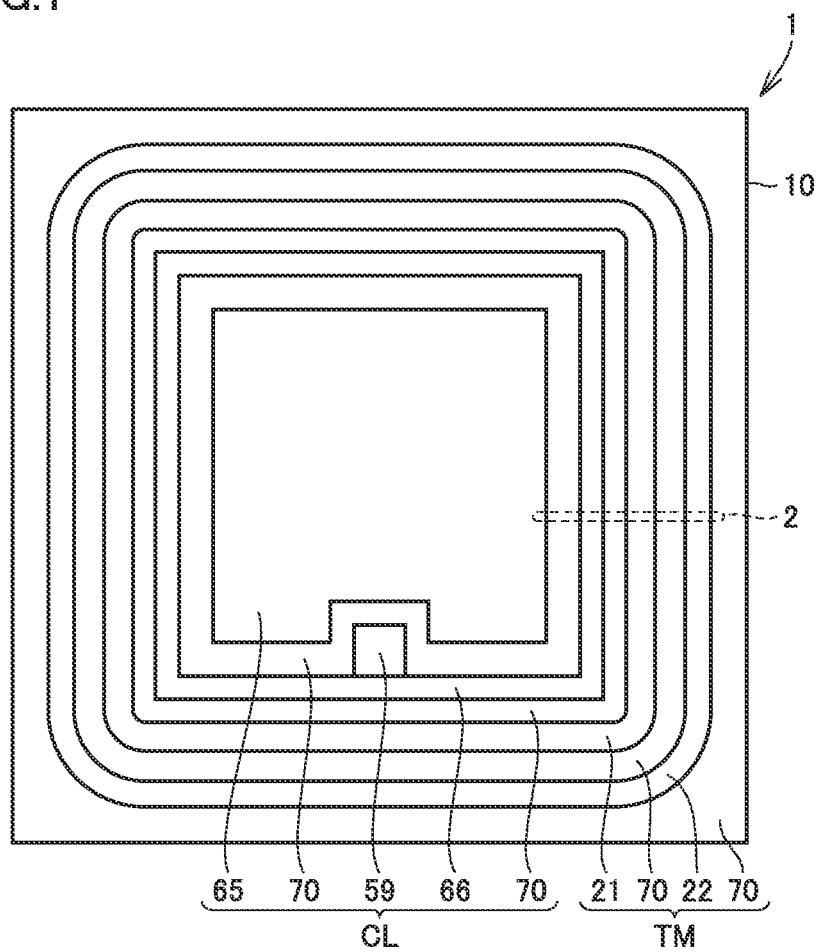
FIG. 1 is a plan view schematically showing a configuration of a silicon carbide semiconductor device 1 according to a first embodiment of the present invention.

[Description of Embodiment of the Invention of the Present Application]

First, embodiments of the present invention are listed and described.

(1) A silicon carbide semiconductor device (1, 1A, 1B) according to an embodiment of the present invention includes a silicon carbide layer (10) having a first main surface (10a) and a second main surface (10b) opposite to the first main surface (10a). The silicon carbide layer (10) includes: a drift layer (12) having first conductivity type and defining the first main surface (10a) of the silicon carbide layer (10); a first region (13a) provided in the drift layer (12), the first region (13a) having second conductivity type different from the first conductivity type, the first region (13a) defining an outer circumference portion of an element region (CL) in which a transistor element (7) is provided; and a second region (21) provided external to the first region (13a) in the drift layer (12), the second region (21) having the second conductivity type, the second region (21) being electrically connected to the first region (13a). The first region (13a) is provided with at least one opening (30a) through which the drift layer (12) is exposed. The silicon carbide semiconductor device (1, 1A, 1B) further includes a Schottky electrode (25) provided in the opening (30a) and forming a Schottky junction with the drift layer (12).

According to the above-mentioned configuration, there can be provided a silicon carbide semiconductor device allowing for integration of a transistor element and a Schottky barrier diode while avoiding reduction of an active region and decrease of a breakdown voltage. The Schottky barrier diode is formed at the outer circumference portion (first region) of the element region. Therefore, transistor elements can be provided in high density in the element region. Accordingly, it is possible to avoid decrease of the area of an active region, i.e., a region required for flow of current in the silicon carbide semiconductor device. Furthermore, the second region electrically connected to the first region is formed external to the first region. This second region can function as a termination region for securing the breakdown voltage of the silicon carbide semiconductor device. By forming the Schottky barrier diode in the first region, the Schottky barrier diode do not need to be formed in the second region. Accordingly, it becomes possible to avoid an influence over the breakdown voltage of the silicon carbide semiconductor device.

It should be noted that the expression "electrically connected" is intended to encompass not only direct connection but also indirect connection via a conductor. Two elements electrically connected to each other does not necessarily need to have an equal potential.

(2) Preferably, the Schottky electrode (25) forms a Schottky junction with both the drift layer (12) and the first region (13a).

According to this configuration, since the Schottky electrode also forms a Schottky junction with the first region, the Schottky electrode can directly inject and draw carriers into/from the first region. Therefore, the breakdown voltage can be secured more surely.

When a depletion layer exists between the drift layer and the first region, the depletion layer can be reduced more quickly by injecting carriers from the Schottky electrode to the first region. It should be noted that in this specification, the reduction of the depletion layer is also referred to as "canceling of depletion".

On the other hand, when applying a reverse bias voltage between the drift layer and the first region, carriers are drawn from the Schottky electrode, thereby expanding the depletion layer more quickly. Accordingly, the breakdown voltage can be secured.

(3) Preferably, the silicon carbide semiconductor device (1, 1A, 1B) further includes: a third region (14) provided in the first region (13a) and having the first conductivity type; a fourth region (18) provided in the first region (13a) and having the second conductivity type; and a pad electrode (65) electrically connected to the third region (14), the fourth region (18), and the Schottky electrode (25).

According to this configuration, a transistor and a free wheel diode can be integrated in one semiconductor chip. Accordingly, a circuit including a transistor and a free wheel diode, such as an inverter circuit, can be implemented with a smaller and simpler configuration.

(4) Preferably, the at least one opening (30a) is a plurality of openings (30a) separated from each other by spaces (al). The plurality of openings (30a) are provided along the outer circumference portion in the element region (CL).

With this configuration, it is possible to avoid decrease of the area of the active region, i.e., the region required for flow of a current in the silicon carbide semiconductor device. Further, by providing the plurality of openings with the spaces therebetween, a region inwardly of the plurality of openings and a region outwardly of the plurality of openings can be prevented from being divided from each other. Therefore, one of these two regions (for example, the region outwardly of the plurality of openings) can be prevented from having a floating potential.

(5) Preferably, the spaces between the plurality of openings have a constant length (al).

According to this configuration, the region inwardly of the plurality of openings and the region outwardly of the plurality of openings can be prevented from being divided from each other.

(6) Preferably, the opening (30a) is a trench extending to the drift layer (12) through the first region (13a). The Schottky electrode (25) is provided to cover the trench.

According to this configuration, the area of the Schottky electrode forming a Schottky junction with the silicon carbide layer can be increased. Therefore, more carriers can be injected and drawn via the Schottky electrode.

(7) Preferably, the silicon carbide semiconductor device (1, 1A, 1B) further includes a guard ring region (22) having the second conductivity type, the guard ring region (22) being provided in the drift layer (12) to surround the first and second regions (13a, 21) when viewed in a plan view.

According to this configuration, the breakdown voltage of the silicon carbide semiconductor device can be improved more. It should be noted that the expression "when viewed in a plan view" corresponds to a case of viewing the first main surface (or the second main surface) in the normal direction of the first main surface.

(8) Preferably, the first conductivity type is n type, and the second conductivity type is p type.

According to this configuration, the silicon carbide semiconductor device can be facilitated to be manufactured.

[Details of Embodiments of the Invention of the Present Application]

The following describes an embodiment of the present invention with reference to figures. It should be noted that in the below-mentioned figures, the same or corresponding portions are given the same reference characters and are not described repeatedly. Regarding crystallographic indications in the present specification, an individual orientation is represented by [], a group orientation is represented by <>, and an individual plane is represented by ( ), and a group plane is represented by {}. In addition, a negative index is supposed to be crystallographically indicated by putting "–" (bar) above a numeral, but is indicated by putting the negative sign before the numeral in the present specification. For description of an angle, a system in which an omnidirectional angle is 360° is employed.

<First Embodiment>

FIG. 1 is a plan view schematically showing a configuration of a silicon carbide semiconductor device 1 according to a first embodiment of the present invention. With reference to FIG. 1, silicon carbide semiconductor device 1 according to the one embodiment of the present invention has an element region CL and a termination region TM. Element region CL is provided with a plurality of transistor elements (not shown in FIG. 1). Termination region TM is provided external to element region CL. Furthermore, in the present embodiment, termination region TM surrounds element region CL.

Figure 2:
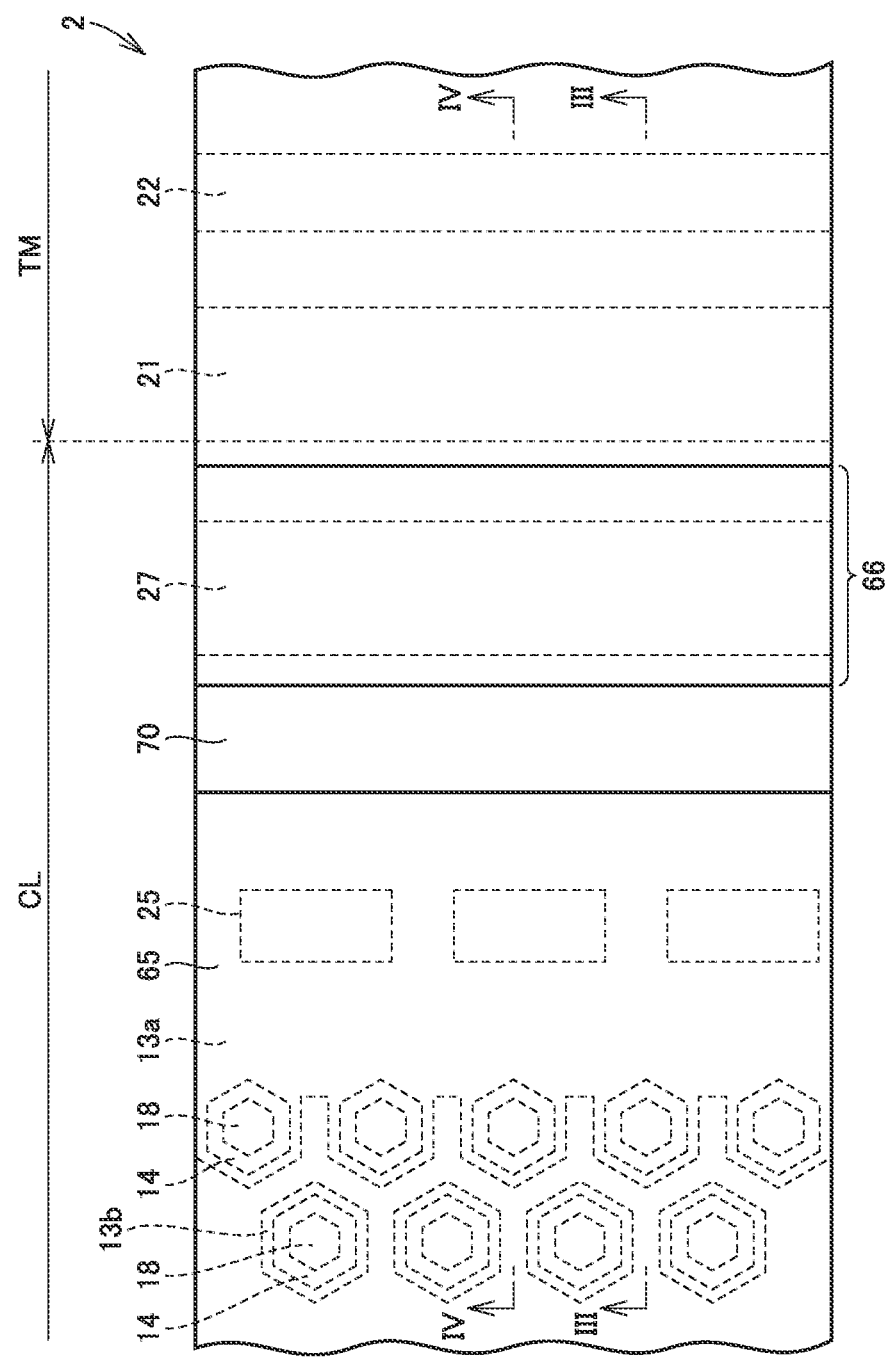
FIG. 2 is a partial enlarged view of a region 2 in silicon carbide semiconductor device 1 shown in FIG. 1.
Figure 3:
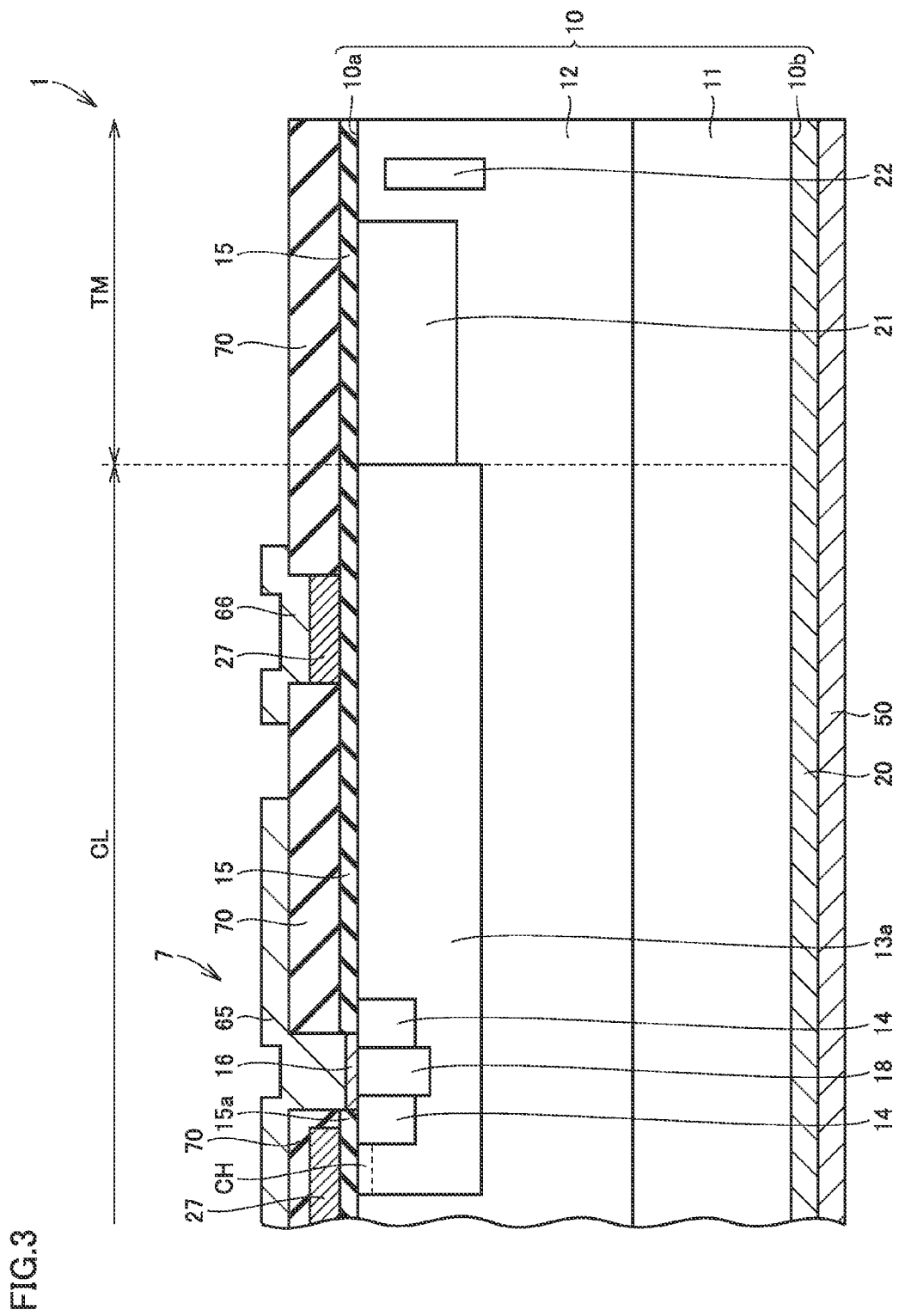
FIG. 3 is a partial cross sectional view along a line of FIG. 2.
Figure 4:
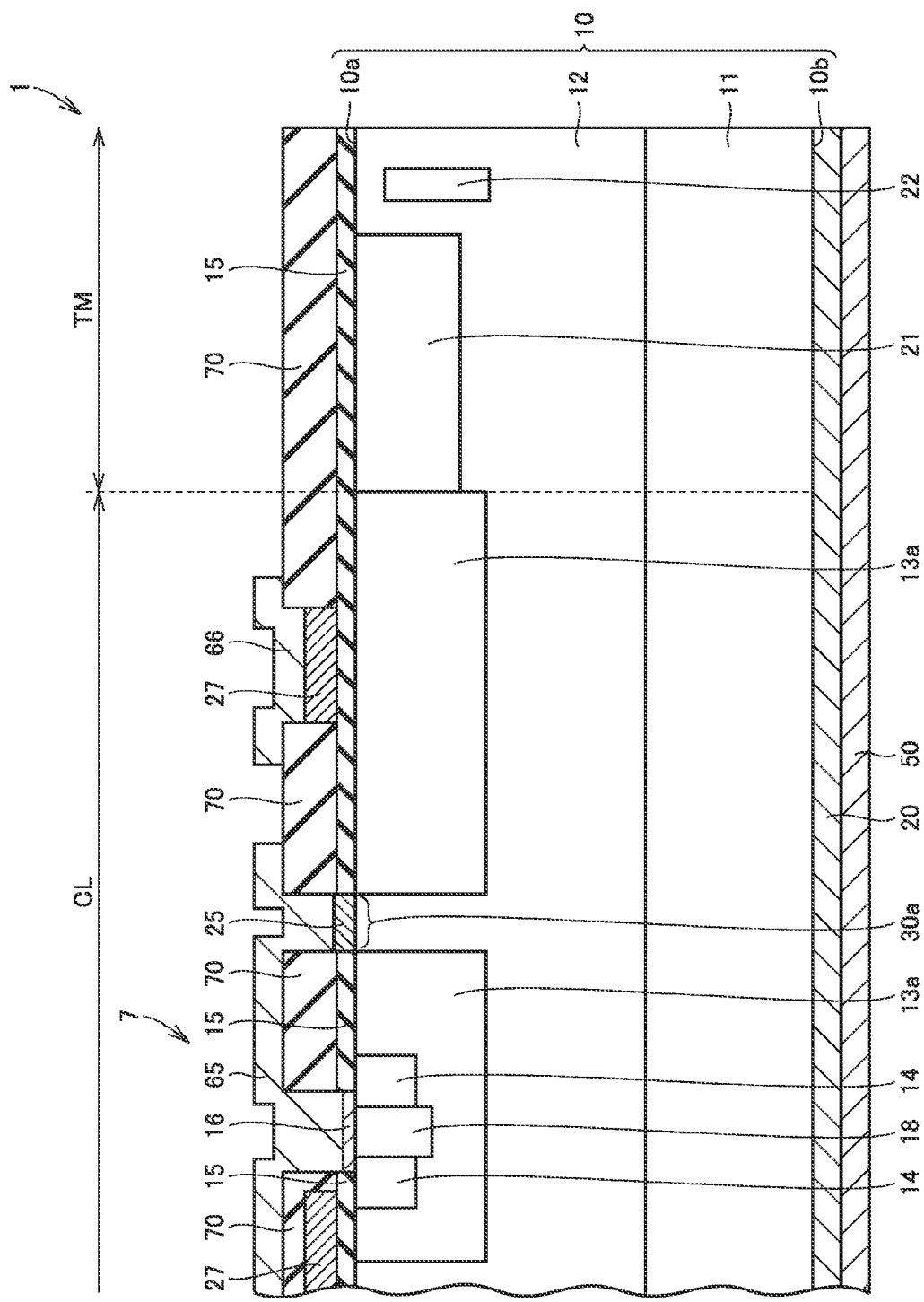
FIG. 4 is a partial cross sectional view along a IV-IV line of FIG. 2.

FIG. 2 is a partial enlarged view of a region 2 in silicon carbide semiconductor device 1 shown in FIG. 1. Region 2 is a region extending over both element region CL and termination region TM. FIG. 3 is a partial cross sectional view along a line of FIG. 2. FIG. 4 is a partial cross sectional view along a IV-IV line of FIG. 2.

With reference to FIG. 2, FIG. 3, and FIG. 4, silicon carbide semiconductor device 1 includes a silicon carbide layer 10, an insulating film 15, a gate insulating film 15a, a source electrode 16, a gate electrode 27, a Schottky electrode 25, an interlayer insulating film 70, a gate runner 66, a drain electrode 20, and a backside surface protecting electrode 50.

Silicon carbide layer 10 has a first main surface 10a and a second main surface 10b. Second main surface 10b is located opposite to first main surface 10a.

Silicon carbide layer 10 has an n$^+$ substrate 11 and a drift layer 12. N$^+$ substrate 11 is made of hexagonal silicon carbide of polytype 4H, for example. N$^+$ substrate 11 includes a high concentration of impurity (donor). The concentration of the impurity in n$^+$ substrate 11 is about $1.0\times10^{18}$ cm$^{-3}$, for example. A type of the impurity is N (nitrogen), for example.

Drift layer 12 is provided on n$^+$ substrate 11. Drift layer 12 is a layer formed by epitaxial growth, for example. Drift layer 12 is made of hexagonal silicon carbide of polytype 4H, for example. Drift layer 12 has a surface that defines first main surface 10a of silicon carbide layer 10.

The impurity concentration in drift layer 12 is lower than the impurity concentration in n$^+$ substrate 11. For example, the impurity concentration in drift layer 12 is about $7.5\times 10^{15}$cm$^{-3}$. Drift layer 12 has a thickness of about not less than 10 μm and about not more than 35 μm, for example. The impurity included in drift layer 12 is nitrogen, for example.

Element region CL is a region in which each of transistor elements 7 is provided. In the present embodiment, transistor element 7 is a MOSFET (Metal Oxide Semiconductor Field Effect Transistor).

Body regions 13a, 13b are formed in drift layer 12. Body regions 13a, 13b implement the body region of the MOSFET. The conductivity type of each of body regions 13a, 13b is p type, which is different from n type.

Body region 13a is a region that defines the outer circumference portion of element region CL. Body region 13b is provided inwardly of body region 13a in element region CL.

The impurity concentration at a depth portion of each of body regions 13a, 13b is about $1\times10^{18}$cm$^{-3}$. Each of body regions 13a, 13b has a thickness of about not less than 0.5 μm and about not more than 1.0 μm, for example.

Source region 14 is a region having n type and is provided in each of body regions 13a, 13b. Source region 14 includes an impurity at a concentration of higher than the concentration of the impurity in drift layer 12. Source region 14 includes the impurity such as P (phosphorus) at a concentration of about $1\times10^{20}$ cm$^{-3}$, for example.

P$^+$ region 18 is a region having p type, and is provided in each of body regions 13a, 13b. P$^+$ region 18 is provided in contact with source region 14. P$^+$ region 18 includes an impurity at a concentration higher than the concentration of the impurity included in each of body regions 13a, 13b. P$^+$ region 18 includes the impurity such as aluminum or boron at a concentration of about $1\times10^{20}$ cm$^{-3}$, for example.

Gate insulating film 15a is provided at a location facing a channel region CH formed in body region 13a. At first main surface 10a of silicon carbide layer 10, gate insulating film 15a is in contact with body regions 13a, 13b, source region 14, and drift layer 12.

Gate insulating film 15a is made of silicon dioxide, for example. Gate insulating film 15a has a thickness (the size of gate insulating film 15a in the normal direction of first main surface 10a) of, for example, about 50 nm.

Gate electrode 27 is provided on gate insulating film 15a. Gate electrode 27 faces drift layer 12, source region 14, and body regions 13a, 13b, so as to extend from above one source region 14 of two transistor elements 7 to above the other source region 14 thereof. Gate electrode 27 is made of a conductor such as aluminum or polysilicon having an impurity added therein, for example.

Source electrode 16 is in contact with source region 14 and p$^+$region 18 and is therefore electrically connected to source region 14 and p$^+$ region 18. Preferably, source electrode 16 is made of a material having nickel and silicon. Source electrode 16 may be made of a material having titanium, aluminum, and silicon. Preferably, source electrode 16 forms an ohmic junction with source region 14 and p$^+$ region 18.

Insulating film 15 covers first main surface 10a of silicon carbide layer 10. Insulating film 15 and gate insulating film 15a are formed simultaneously.

Interlayer insulating film 70 is provided on insulating film 15 and gate insulating film 15a. Interlayer insulating film 70 is made of silicon dioxide, for example.

Source pad electrode 65 is provided on interlayer insulating film 70. Source pad electrode 65 is in contact with source electrode 16 via a contact hole formed in interlayer insulating film 70. Accordingly, source pad electrode 65 is electrically connected to source region 14 and p+ region 18. Source pad electrode 65 is made of aluminum, for example.

Drain electrode 20 is in contact with second main surface 10b of silicon carbide layer 10. Accordingly, drain electrode 20 is electrically connected to n+ substrate 11. Drain electrode 20 may have the same configuration as that of source electrode 16, for example. Alternatively, drain electrode 20 may be made of a different material capable of forming an ohmic junction with n+ substrate 11 such as nickel.

Backside surface protecting electrode 50 is provided in contact with drain electrode 20. Backside surface protecting electrode 50 is made of titanium, nickel, silver, or an alloy thereof, for example.

As shown in FIG. 4, an opening 30a is provided in body region 13a. Through opening 30a, drift layer 12 is exposed at first main surface 10a of the silicon carbide layer. That is, a region below opening 30a has n type conductivity.

Schottky electrode 25 forms a Schottky junction with drift layer 12 via opening 30a. A Schottky barrier diode (SBD) is formed in body region 13a by Schottky electrode 25 and silicon carbide layer 10. The material of Schottky electrode 25 is not particularly limited as long as the material is a metal that can attain a Schottky junction with drift layer 12. Examples of the material of Schottky electrode 25 include titanium (Ti), nickel (Ni), titanium nitride (TiN), gold (Au), molybdenum (Mo), tungsten (W), and the like.

Furthermore, Schottky electrode 25 is contact with source pad electrode 65 via a contact hole formed in interlayer insulating film 70. Accordingly, the source of the MOSFET and the anode of the SBD are electrically connected to each other. On the other hand, the cathode electrode of the SBD is the same as drain electrode 20 of the MOSFET.

Gate runner 66 and a gate pad electrode 59 (see FIG. 1) are provided on gate electrode 27. Each of gate runner 66 and gate pad electrode 59 is formed of a conductor. Gate runner 66 is electrically connected to gate electrode 27 and is electrically connected to gate pad electrode 59.

Termination region TM includes a JTE (Junction Termination Extension) region 21 and a guard ring region 22. Each of JTE region 21 and guard ring region 22 has p type as a conductivity type. Each of JTE region 21 and guard ring region 22 includes an impurity at a concentration less than the impurity concentration of each of body regions 13a, 13b.

JTE region 21 is provided external to body region 13a. In the present embodiment, JTE region 21 is in contact with body region 13a. Accordingly, JTE region 21 is electrically connected to body region 13a. However, a different p type region may be provided between JTE region 21 and body region 13a and JTE region 21 and body region 13a may be electrically connected to each other by the p type region.

Guard ring region 22 is provided external to JTE region 21. Guard ring region 22 is provided to be spaced away from JTE region 21. As shown in FIG. 1, guard ring region 22 is provided in drift layer 12 to surround body region 13a (first region) and JTE region 21 (second region) when viewed in a plan view. With guard ring region 22, the breakdown voltage of silicon carbide semiconductor device 1 can be improved more.

One or a plurality of guard ring regions 22 may be provided. Furthermore, although not shown in the figures, termination region TM may have a field stop region (not shown), which has n type, at the outer circumference side of guard ring region 22.

According to the present embodiment, guard ring region 22 is provided to be spaced away from first main surface 10a of silicon carbide layer 10. That is, an n type region is provided between first main surface 10a of silicon carbide layer 10 and guard ring region 22. However, the upper end of guard ring region 22 may be aligned with first main surface 10a of silicon carbide layer 10.

Figure 5:
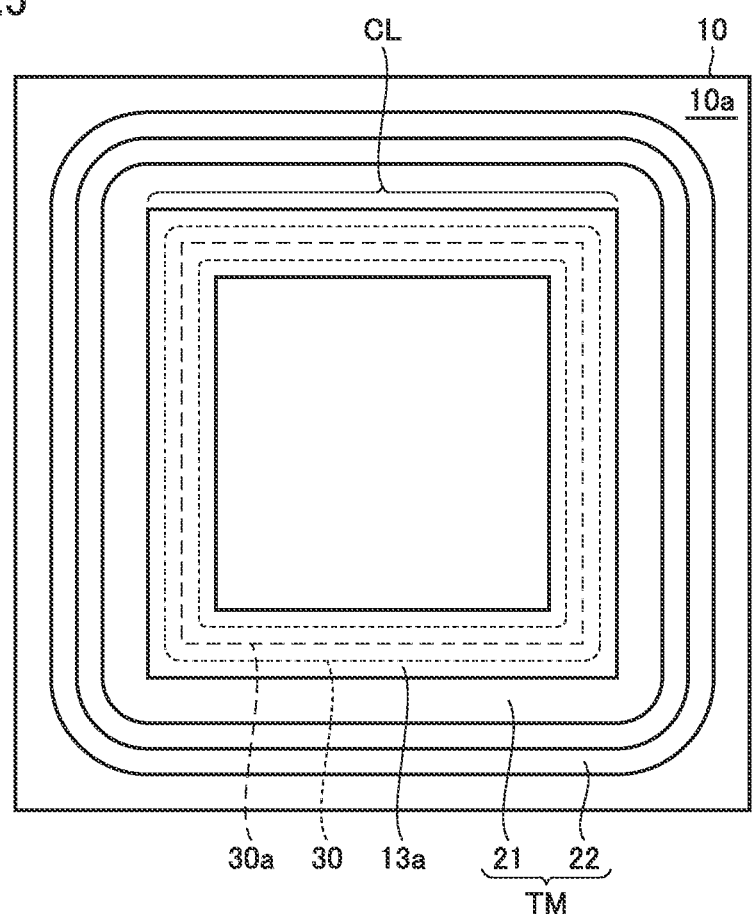

FIG. 5 is a schematic plan view of silicon carbide layer 10 for illustrating the position of opening 30a. With reference to FIG. 5, a plurality of openings 30a are provided along the outer circumference portion (body region 13a) in element region CL. The plurality of openings 30a are represented by an opening region 30, which is a continuous region. Opening region 30, i.e., the plurality of openings 30a, is provided to surround a portion inwardly of body region 13a.

Figure 6:
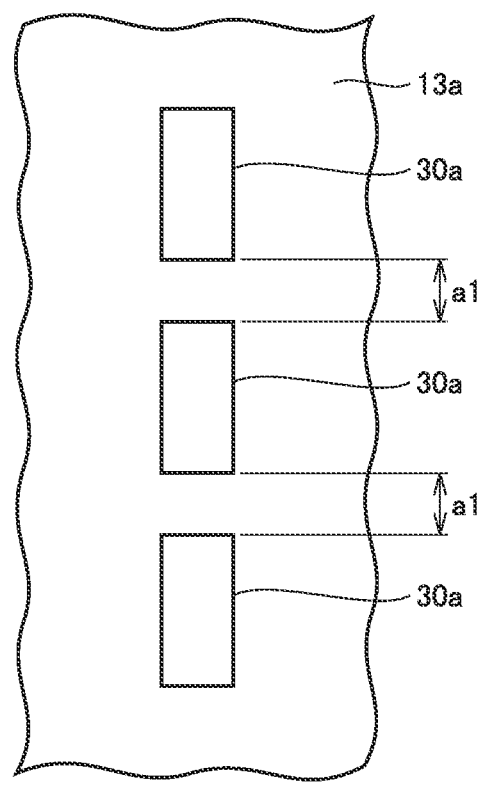

FIG. 6 is a partial enlarged view of body region 13a for illustrating openings 30a. With reference to FIG. 6, the plurality of openings 30a are separated from each other by a constant distance a1.

With such a configuration, it is possible to avoid decrease of the area of the active region, i.e., the region required for flow of a current in the silicon carbide semiconductor device. Further, the region inwardly of the plurality of openings and the region outwardly of the plurality of openings can be prevented from being divided from each other.

In each of openings 30a, drift layer 12 is exposed. In other words, a region just below opening 30a is an n type region. Accordingly, if one continuous opening (in other words, opening without any interruption) is formed in body region 13a, body region 13a is divided into a region inwardly of the opening and a region outwardly of the opening. The region inwardly of the opening is fed with a potential by source electrode 16 and source pad electrode 65. On the other hand, the region outwardly of the opening has a floating potential. By providing the plurality of openings with the spaces therebetween, these two regions are electrically connected to each other. Therefore, the potential of the region outwardly of the openings can be prevented from being the floating potential.

The plurality of openings 30a can be formed, for example, by the following method. First, CVD (Chemical Vapor Deposition) is employed to form an oxide film made of silicon dioxide on first main surface 10a of silicon carbide layer 10. Then, a photoresist is applied on the oxide film. By exposure and development, a photoresist film having an opening pattern is formed. This opening pattern corresponds to body regions 13a, 13b. However, the photoresist film remains in the region in which openings 30a are to be formed.

The resist film is used as a mask to partially remove the oxide film by means of, for example, RIE (Reactive Ion Etching). Accordingly, the oxide film is removed via the opening pattern corresponding to body regions 13a, 13b. However, the oxide film remains in the region for forming openings 30a.

Next, an ion implantation step is performed. In the ion implantation step, ions of aluminum or the like are implanted into first main surface 10a of silicon carbide layer 10, for example. The ions are implanted via the opening pattern corresponding to body regions 13a, 13b. However, the ions are not implanted into the region corresponding to openings 30a. As a result, drift layer 12 is exposed through openings 30a.

Figure 7:
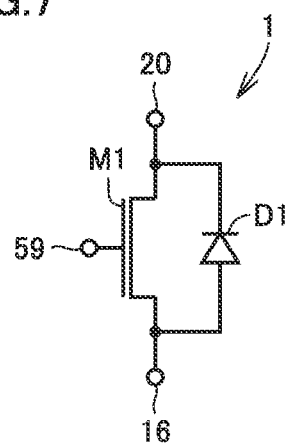
FIG. 7 is an equivalent circuit diagram of silicon carbide semiconductor device 1 according to the first embodiment.

FIG. 7 is an equivalent circuit diagram of silicon carbide semiconductor device 1 according to the first embodiment. With reference to FIG. 7, silicon carbide semiconductor device 1 has a MOS transistor M1 and a Schottky barrier diode D1.

MOS transistor M1 represents an integrated transistor element 7. The drain electrode of MOS transistor M1 and the cathode electrode of Schottky barrier diode D1 are electrically connected to each other. The drain electrode of MOS transistor M1 and the cathode electrode of Schottky barrier diode D1 are implemented by drain electrode 20.

The source electrode of MOS transistor M1 and the anode electrode of Schottky barrier diode D1 are electrically connected to each other. The source electrode of MOS transistor M1 is implemented by source electrode 16 (and source pad electrode 65) shown in FIG. 3 and FIG. 4. On the other hand, the anode electrode of Schottky barrier diode D1 is implemented by Schottky electrode 25. This Schottky electrode 25 is electrically connected to the source of the MOSFET via source electrode 16 and source pad electrode 65.

Figure 8:
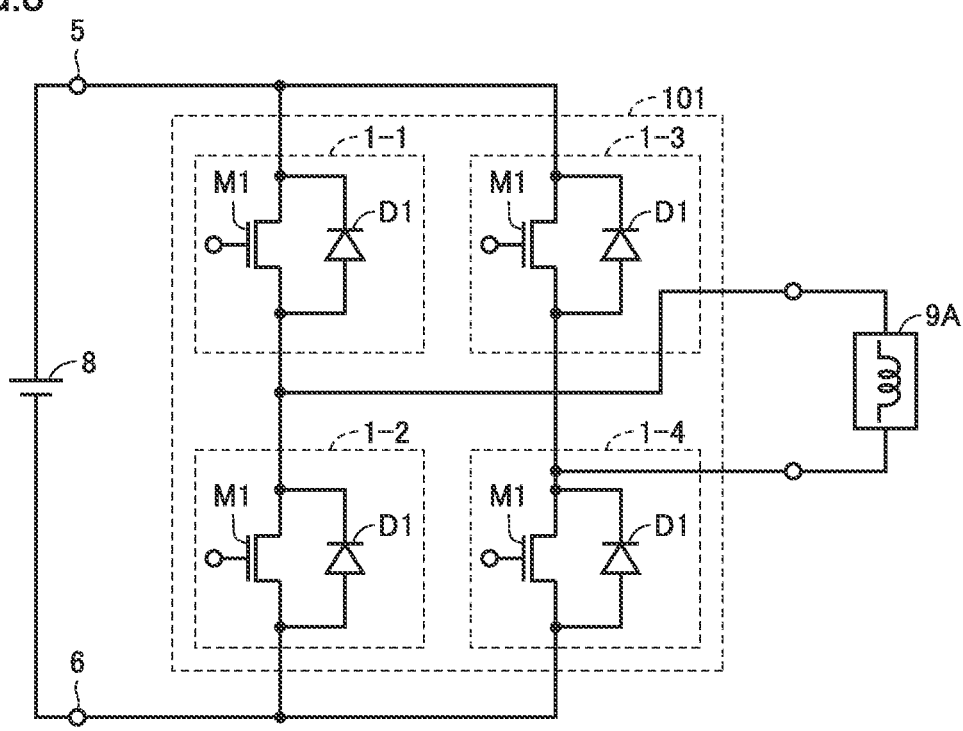
FIG. 8 is a circuit diagram showing an exemplary inverter circuit constituted of silicon carbide semiconductor device 1 according to the present embodiment.

FIG. 8 is a circuit diagram showing an example of an inverter circuit constituted of silicon carbide semiconductor devices 1 according to the present embodiment. With reference to FIG. 8, inverter circuit 101 is a single-phase inverter. Inverter circuit 101 is connected to the positive electrode and negative electrode of a direct current power supply 8 via a positive electrode terminal 5 and a negative electrode terminal 6. Inverter circuit 101 converts direct current power supplied from direct current power supply 8 into a single-phase alternating current. A single-phase load 9A is an inductive load, such as a single-phase motor. However, the type of single-phase load 9A is not particularly limited.

Inverter circuit 101 includes silicon carbide semiconductor devices 1-1 to 1-4. Each of silicon carbide semiconductor devices 1-1 to 1-4 has the same configuration as the configuration shown in FIG. 7. Therefore, each of silicon carbide semiconductor devices 1-1 to 1-4 can be implemented by silicon carbide semiconductor device 1 according to the present embodiment.

Silicon carbide semiconductor devices 1-1, 1-2 are connected in series between positive electrode terminal 5 and negative electrode terminal 6. Similarly, silicon carbide semiconductor devices 1-3, 1-4 are connected in series between positive electrode terminal 5 and negative electrode terminal 6.

It should be noted that inverter circuit 101 may be a three-phase inverter. In this case, the two silicon carbide semiconductor devices connected in series between positive electrode terminal 5 and negative electrode terminal 6 may be added to the configuration shown in FIG. 8.

When switching a load including an inductance component, i.e., inductive load, a large amount of current such as a surge current may be generated. This surge current may result in damage of the MOS transistor. In order to avoid damage of the MOS transistor, a free wheel diode is connected to the MOS transistor in antiparallel.

In many examples, a free wheel diode is implemented by a chip different from a MOS transistor, or a discrete element. On the other hand, in the present embodiment, the MOS transistor and the SBD are integrated in one semiconductor chip. Therefore, the inverter circuit can be implemented with a smaller and simpler configuration. Therefore, a system excellent in terms of cost can be constructed.

By providing the SBD in element region CL, the number of transistor elements provided in element region CL is decreased. That is, the area of the active region of the silicon carbide semiconductor device is decreased. According to the present embodiment, the SBD is formed in body region 13a that defines the outer circumference of element region CL. In other words, the SBD is not provided inwardly of body region 13a. Since all the transistor elements are provided inwardly of the SBD, the active region can be avoided from being decreased.

Furthermore, each of JTE region 21 and guard ring region 22 may function as termination region TM for securing the breakdown voltage of silicon carbide semiconductor device 1. In the present embodiment, Schottky electrode 25 is provided at body region 13a. Accordingly, the SBD is formed in body region 13a. In other words, no Schottky barrier diode is formed in termination region TM. Accordingly, it becomes possible to avoid an influence over the breakdown voltage of the silicon carbide semiconductor device.

Further, according to the present embodiment, the plurality of openings 30a are formed in body region 13a and Schottky electrode 25 forms a Schottky junction with drift layer 12 in each of the plurality of openings 30a. Accordingly, an SBD having a sufficient size can be implemented, whereby a large amount of current can flow in the SBD.

<Second Embodiment>

Figure 9:
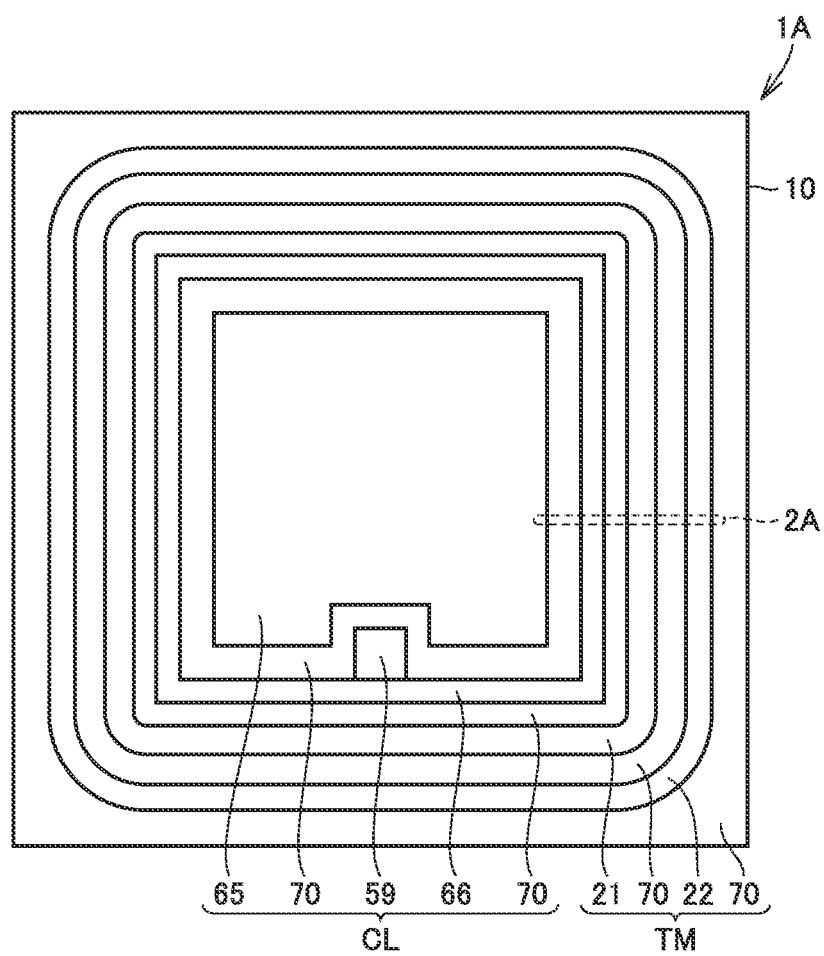
FIG. 9 is a plan view schematically showing a configuration of a silicon carbide semiconductor device 1A according to a second embodiment of the present invention.

FIG. 9 is a plan view schematically showing a configuration of a silicon carbide semiconductor device 1A according to a second embodiment of the present invention. With reference to FIG. 1 and FIG. 9, the configuration of silicon carbide semiconductor device 1A is basically the same as that of silicon carbide semiconductor device 1 according to the first embodiment. Silicon carbide semiconductor device 1A according to the second embodiment is different from silicon carbide semiconductor device 1 according to the first embodiment in terms of the position of the Schottky electrode. Hereinafter, this difference will be described in detail.

Figure 10:
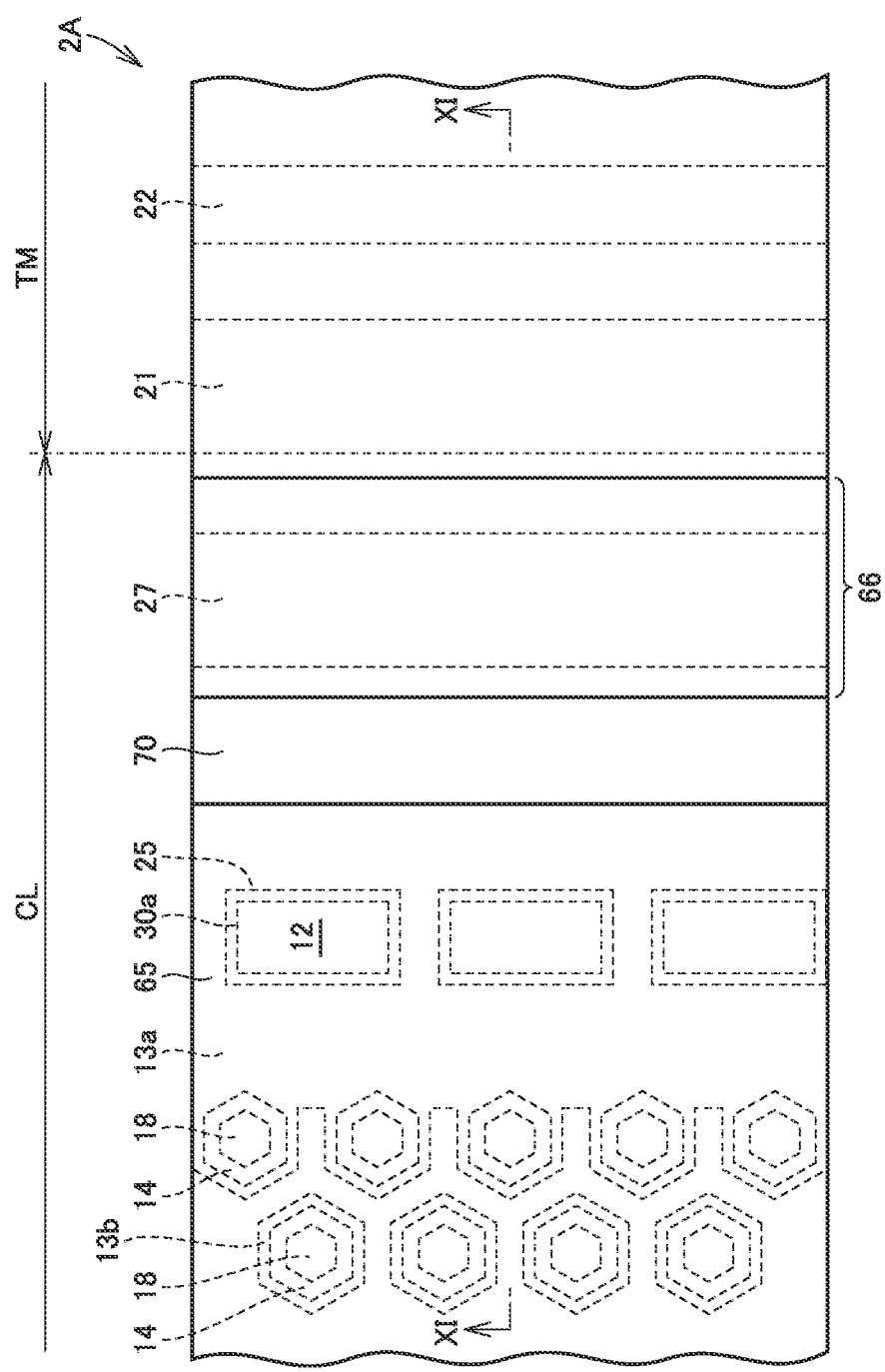
FIG. 10 is a partial enlarged view of a region 2A in silicon carbide semiconductor device 1A shown in FIG. 9.
Figure 11:
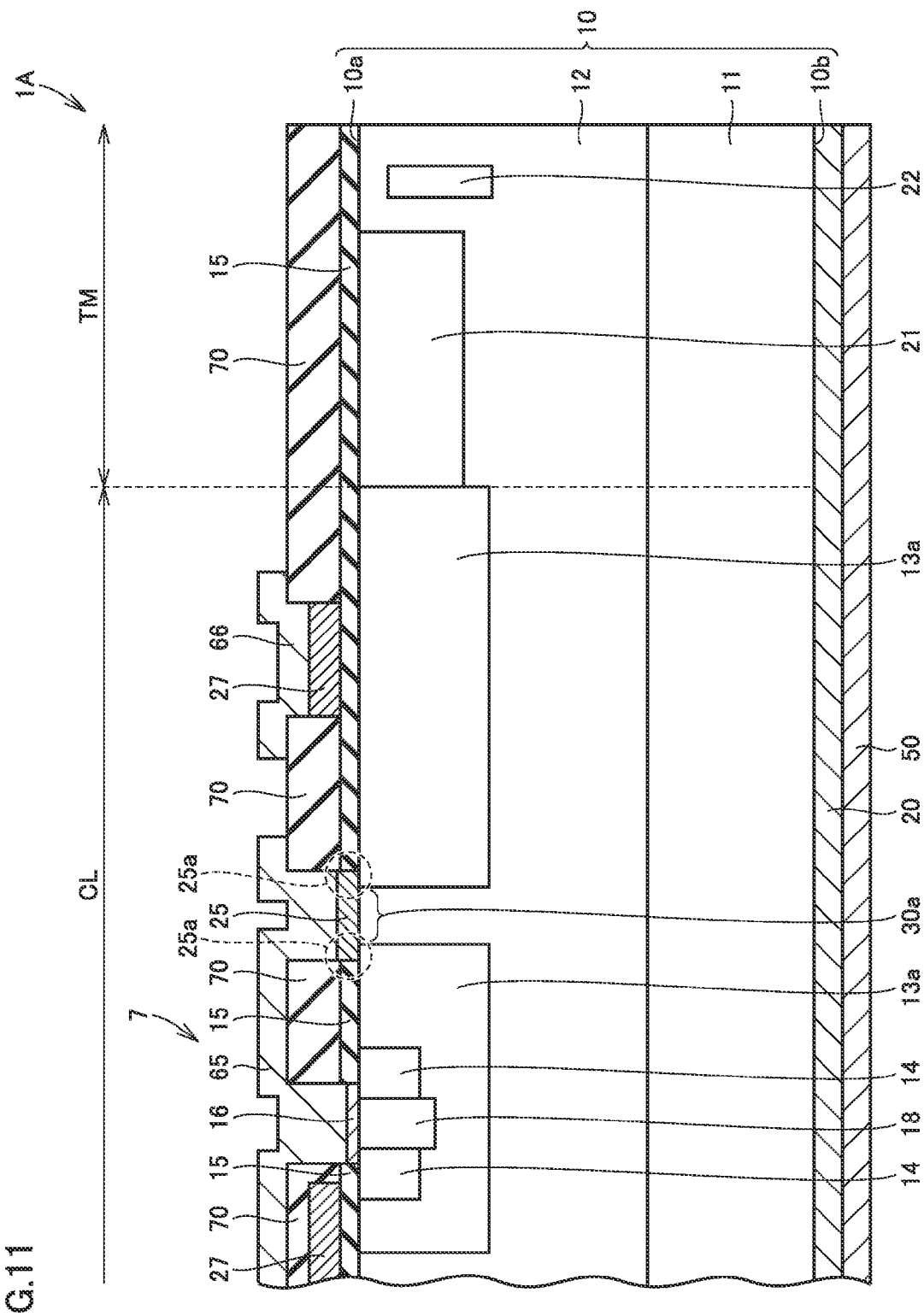
FIG. 11 is a partial cross sectional view along a XI-XI line of FIG. 10.

FIG. 10 is a partial enlarged view of a region 2A within silicon carbide semiconductor device 1A shown in FIG. 9. Region 2A is a region extending over both element region CL and termination region TM. FIG. 11 is a partial cross sectional view along a XI-XI line of FIG. 10.

With reference to FIG. 10 and FIG. 11, Schottky electrode 25 is provided to cover both drift layer 12 and body region 13a. In other words, opening 30a is closed by Schottky electrode 25 when viewed in a plan view.

Schottky electrode 25 has an end portion 25a covering body region 13a. Therefore, Schottky electrode 25 forms a Schottky junction with both body region 13a and drift layer 12.

It should be noted that the positions of openings 30a in the second embodiment are the same as the positions of openings 30a in the first embodiment. That is, as shown in FIG. 5, opening region 30 is provided in body region 13a to surround the region inwardly of body region 13a (in other words, inside of element region CL). Moreover, as shown in FIG. 6, the plurality of openings 30a are separated from each other by constant distance a1.

According to the second embodiment, the same effect as that of the first embodiment can be attained. In particular, according to the second embodiment, Schottky electrode 25 forms a Schottky junction with not only drift layer 12 but also body region 13a.

With this configuration, the switching characteristic of silicon carbide semiconductor device 1A can be improved. Accordingly, the breakdown voltage of silicon carbide semiconductor device 1A can be increased more. This effect will be described more in detail with reference to the figures.

Figure 12:
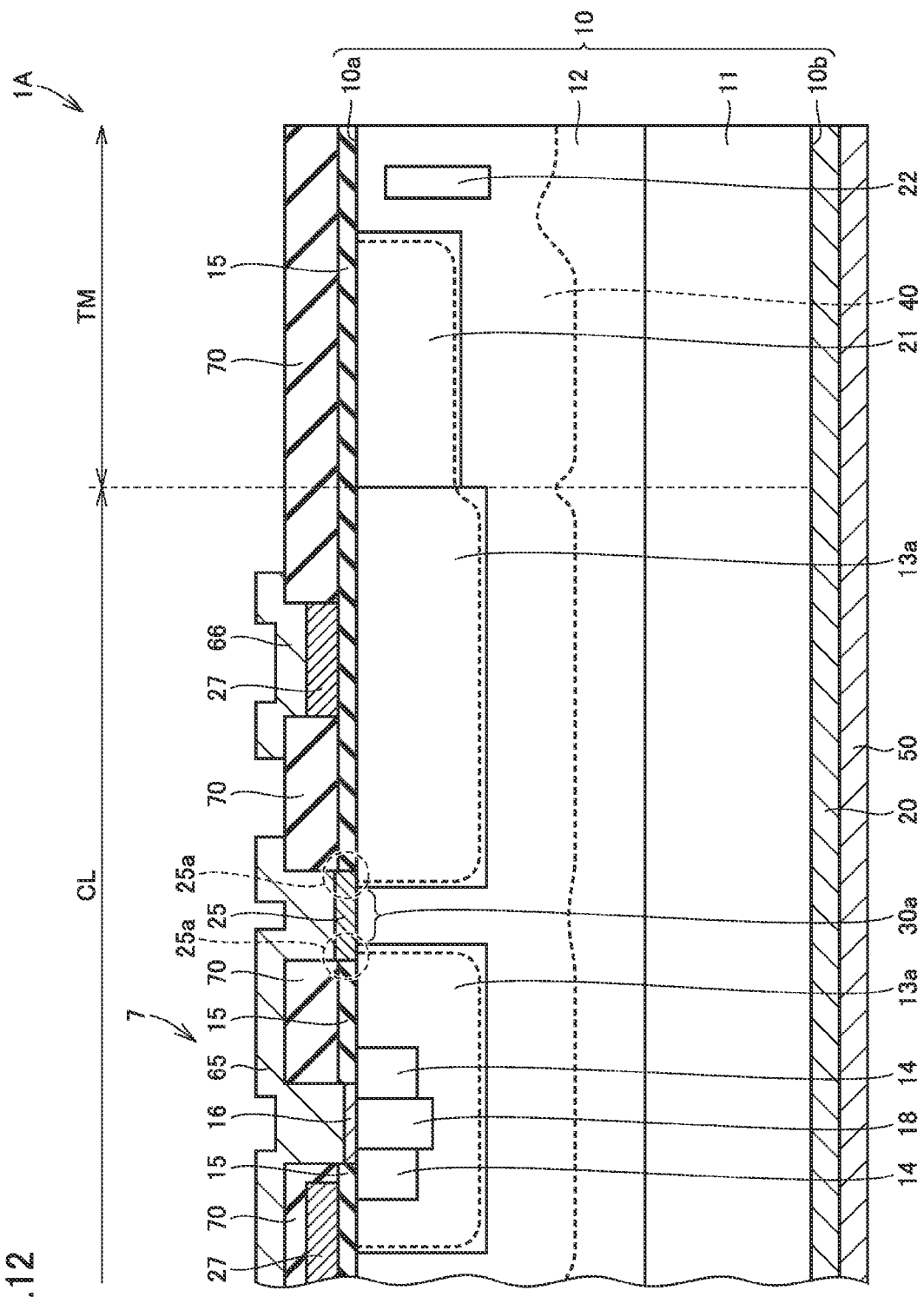
FIG. 12 is a cross sectional view schematically showing a state in which a reverse bias voltage is applied to silicon carbide semiconductor device 1A according to the second embodiment.

FIG. 12 is a cross sectional view schematically showing a state in which a reverse bias voltage is applied to silicon carbide semiconductor device 1A according to the second embodiment. With reference to FIG. 12, when the MOSFET (transistor element 7) is in the OFF state, a voltage is applied between drain electrode 20 and source pad electrode 65 such that the potential of drain electrode 20 becomes higher than the potential of source pad electrode 65. Such a state may take place during an operation of inverter circuit 101 shown in FIG. 8. In this case, a depletion layer 40 is expanded from a boundary surface (junction portion) between drift layer 12 and body region 13a. Furthermore, since body region 13a and JTE region 21 are electrically connected to each other, depletion layer 40 is expanded from the boundary surface (junction portion) between drift layer 12 and JTE region 21. Furthermore, guard ring region 22 is depleted. Accordingly, depletion layer 40 extends to the termination region TM side.

As the switching speed of the MOSFET becomes faster, holes may be unable to be sufficiently injected into and drawn from the p type region. This may make it difficult to smoothly switch between depletion of the pn junction and canceling of the depletion. In such a case, the switching speed of the MOSFET has to be slow.

In the present embodiment, Schottky electrode 25 forms a Schottky junction with not only drift layer 12 but also body region 13a. Therefore, carriers can be smoothly (more quickly) injected into and drawn from body region 13a and JTE region 21. Accordingly, the switching speed of transistor element 7 can be improved. Furthermore, the breakdown voltage of transistor element 7 can also be improved.

Specifically, when a forward current flows in the SBD, the potential of Schottky electrode 25 becomes higher than the potential of drain electrode 20. In this case, electrons injected from drain electrode 20 can be moved to Schottky electrode 25. Accordingly, depletion layer 40 formed at the drift layer 12 side can be reduced (canceled) in a short time. On the other hand, holes are injected into body region 13a and JTE region 21 from Schottky electrode 25, thereby canceling depletion of body region 13a and JTE region 21 in a short time.

Body region 13a extends toward the outside of element region CL. Further, holes have mobility smaller than that of electrons. Hence, only by injection of holes from source electrode 16, it is difficult to cancel depletion in both body region 13a and JTE region 21.

In order to solve this problem, it is considered to increase the impurity concentration of body region 13a. However, the depletion layer is accordingly less likely to be expanded toward body region 13a and JTE region 21, thereby presumably resulting in a decreased breakdown voltage of transistor element 7. Moreover, when the insulating film is formed using an oxide film on a surface of a p type region in a silicon carbide semiconductor, reliability of the oxide film is more likely to be decreased as the impurity concentration of the p type region becomes higher.

According to the present embodiment, holes are injected from Schottky electrode 25, whereby depletion layer 40 formed in the portion of body region 13a and JTE region 21 can be canceled in a short time without increasing the impurity concentration of body region 13a.

On the other hand, when a reverse bias is applied to the SBD and the MOSFET, the potential of Schottky electrode 25 becomes lower than the potential of drain electrode 20. In this case, electrons are drawn from drift layer 12 by drain electrode 20. On the other hand, holes are drawn from body region 13a and JTE region 21 by source pad electrode 65 and Schottky electrode 25.

Also in this case, Schottky electrode 25 is provided external to source electrode 16, whereby holes can be drawn faster from JTE region 21 and the portion of body region 13a external to Schottky electrode 25. Therefore, depletion layer 40 can be expanded more quickly. By expanding depletion layer 40 as fast as possible, the strength of the electric field applied to depletion layer 40 can be reduced. Accordingly, the breakdown voltage of silicon carbide semiconductor device 1 (MOSFET) can be improved.

Thus, according to the second embodiment, with end portion 25a of Schottky electrode 25, holes can be directly injected into and drawn from body region 13a. Therefore, the switching characteristic of the silicon carbide semiconductor device (MOSFET) can be improved more. Furthermore, the breakdown voltage of the silicon carbide semiconductor device can be secured more surely.

<Third Embodiment>

Figure 13:
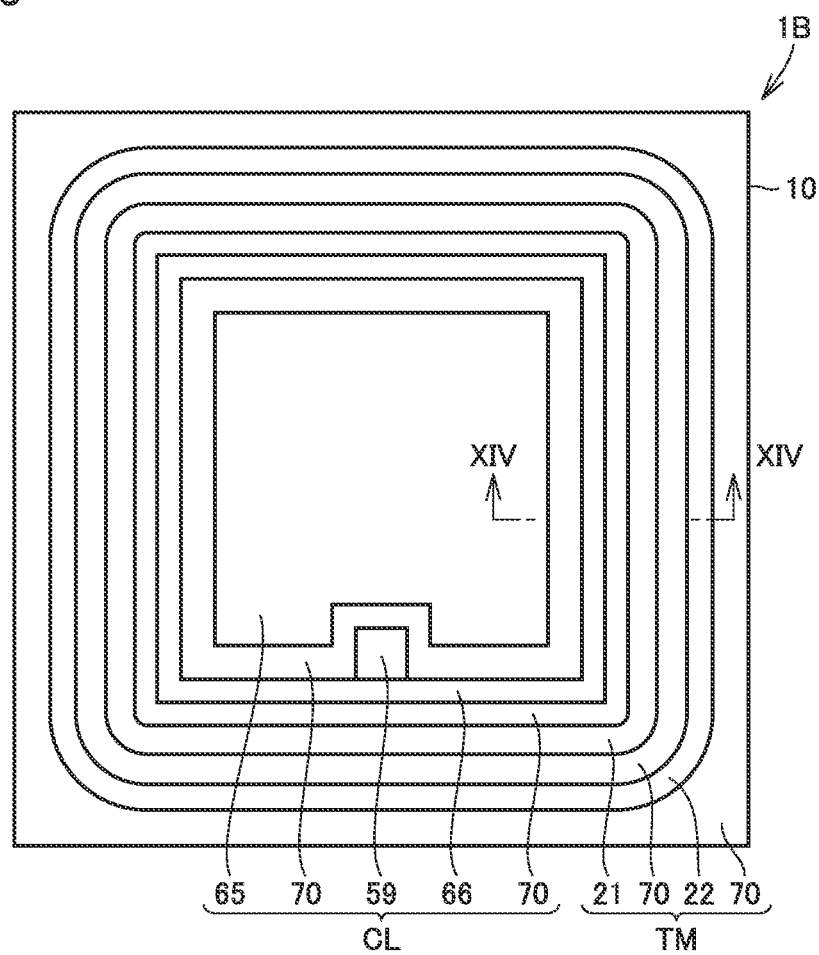
FIG. 13 is a plan view schematically showing a configuration of a silicon carbide semiconductor device 1B according to a third embodiment of the present invention.

FIG. 13 is a plan view schematically showing a configuration of a silicon carbide semiconductor device 1B according to a third embodiment of the present invention. With reference to FIG. 1 and FIG. 13, the configuration of silicon carbide semiconductor device 1B is basically the same as that of silicon carbide semiconductor device 1 according to the first embodiment. Silicon carbide semiconductor device 1B according to the third embodiment is different from silicon carbide semiconductor device 1 according to the first embodiment in terms of the cross sectional shape of the SBD. Hereinafter, this difference will be described in detail.

Figure 14:
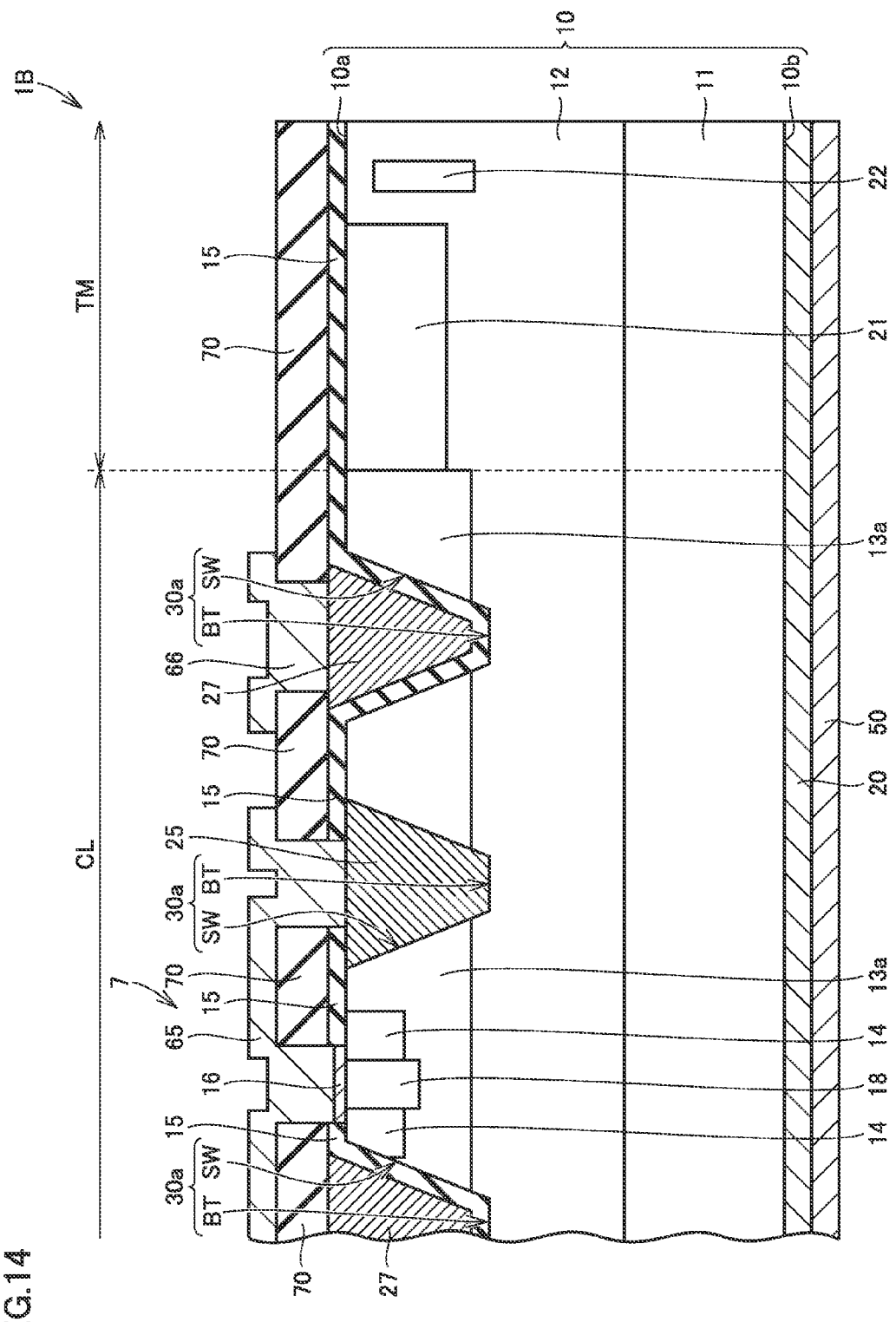
FIG. 14 is a partial cross sectional view along a XIV-XIV line of FIG. 13.

FIG. 14 is a partial cross sectional view along a XIV-XIV line of FIG. 13. With reference to FIG. 14, opening 30a is a trench having side wall surfaces SW and a bottom surface BT.

Each of side wall surfaces SW is a surface inclined relative to main surface 10a of silicon carbide layer 10 so as to come close to main surface 10b of silicon carbide layer 10. In other words, two side wall surfaces SW facing each other are expanded in a tapered manner toward first main surface 10a of silicon carbide layer 10.

Side wall surface SW is a surface inclined relative to a {000-1} plane by not less than 50° and not more than 80°, for example. More specifically, side wall surface SW can have one of plane orientations of {0-33-8}, {0-11-2},{0-11-4} and {0-11-1} when viewed macroscopically. It should be noted that the term "macroscopically" refers to "disregarding a fine structure having a size of approximately interatomic spacing". For the measurement of such a macroscopic off angle, a method employing general X-ray diffraction can be used, for example.

Such an opening 30a can be formed by thermal etching, for example. The "thermal etching" in the present specification refers to an etching process that is performed by subjecting an object, to be etched, to an etching gas under a high temperature, and that has substantially no physical etching function. A process gas for the thermal etching contains a halogen element. More preferably, the halogen element is chlorine or fluorine. Specifically, a process gas containing at least one of $Cl_2$, $BCl_3$, $CF_4$ and $SF_6$ can be used as the process gas, and $Cl_2$ can be used particularly suitably.

Moreover, the process gas preferably further contains oxygen gas. Further, the process gas may contain a carrier gas. Examples of the carrier gas include nitrogen gas, argon gas, or helium gas.

Preferably, the heat treatment temperature of the thermal etching is not less than 700° C. and not more than 1200° C. The lower limit of this temperature is more preferably 800° C., further preferably 900° C. Accordingly, the etching rate can attain a sufficiently practical value. Further, the upper limit of this temperature is more preferably 1100° C., further preferably 1000° C. When the heat treatment temperature is set at not less than 700° C. and not more than 1000° C., a rate of etching SiC is approximately, for example, 70 μm/hr.

Side wall surface SW extends from first main surface 10a of silicon carbide layer 10 to drift layer 12 through body region 13a. Bottom surface BT is a surface formed in drift layer 12. In other words, a junction surface between body region 13a and drift layer 12 crosses side wall surface SW. Drift layer 12 is exposed through bottom surface BT.

Figure 15:
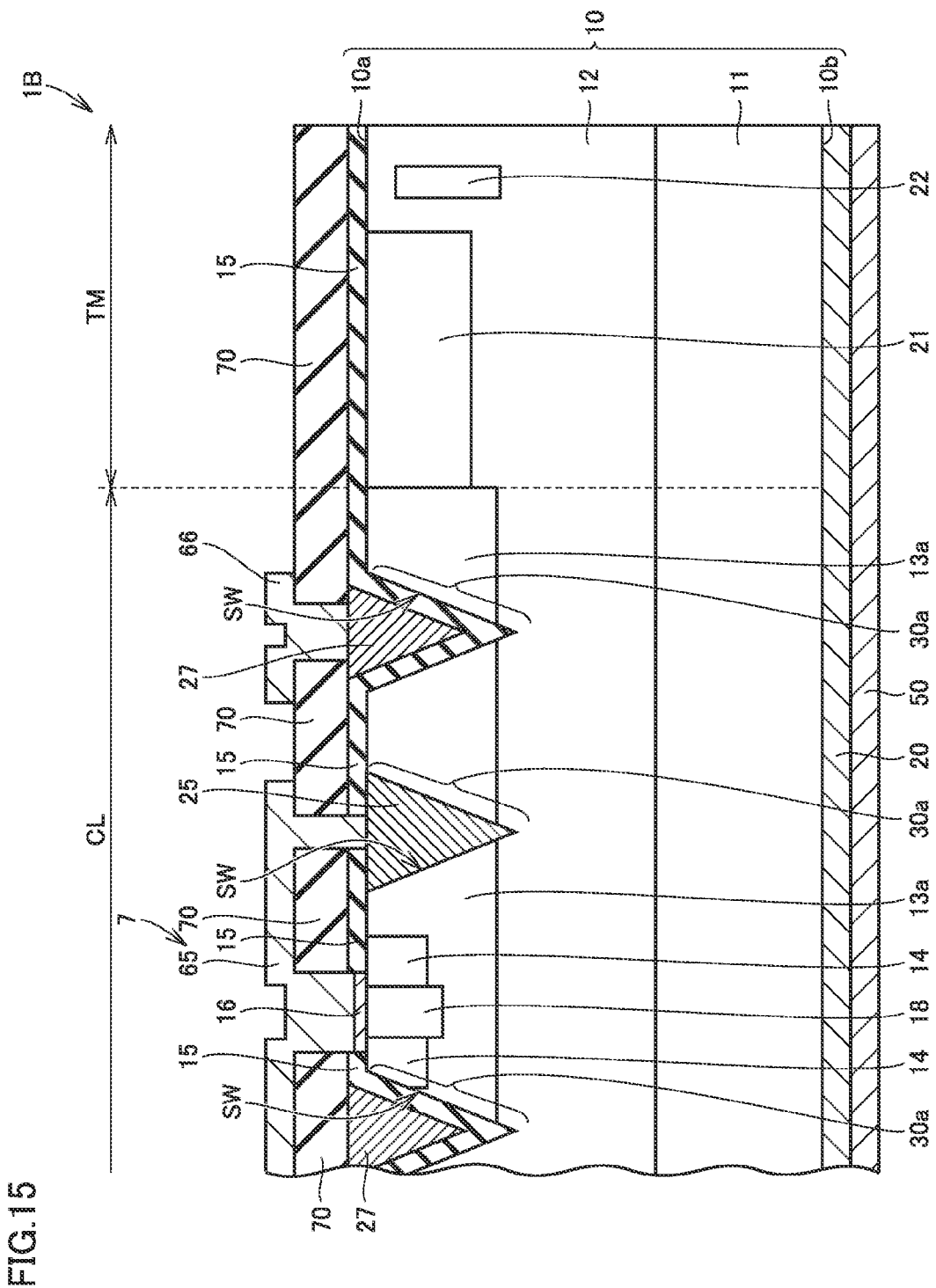
FIG. 15 is a cross sectional view showing another configuration of silicon carbide semiconductor device 1B according to the third embodiment.

Schottky electrode 25 is provided to cover the inner circumferential surface of the trench. Therefore, Schottky electrode 25 is provided to extend over both body region 13a and drift layer 12. That is, Schottky electrode 25 forms a Schottky junction with both body region 13 and drift region 12. It should be noted that as shown in FIG. 15, opening 30a may be filled with Schottky electrode 25.

According to the third embodiment, the same effect as those of the first embodiment and the second embodiment can be attained. Particularly, according to the third embodiment, the area of Schottky electrode 25 forming a Schottky junction with silicon carbide layer 10 (body region 13a and drift layer 12) can be increased. Therefore, more carriers can be injected and drawn via the Schottky electrode.

In the case where the current flows in the forward direction in the SBD, more carriers (electrons) can be injected from Schottky electrode 25 into drift layer 12. Accordingly, it also becomes possible to cancel depletion in drift layer 12 quickly.

In the case where a reverse bias is applied to the SBD and transistor element 7, more holes can be drawn from body region 13a and JTE region 21 by Schottky electrode 25. Accordingly, depletion layer 40 can be expanded more quickly.

FIG. 15 is a cross sectional view showing another configuration of silicon carbide semiconductor device 1B according to the third embodiment. As shown in FIG. 15, bottom surface BT may be omitted from opening 30a. In other words, opening 30a may have a V-like cross sectional shape. According to such a configuration, the size of opening 30a can be small. According to this configuration, side wall surface SW is a surface through which drift layer 12 is exposed.

It should be noted that the plurality of openings 30a may be provided to surround the region inwardly of body region 13a twice. The size or number of opening(s) 30a can be changed depending on a factor such as a magnitude of current flowing in the SBD.

Moreover, in the embodiment described above, the shape of opening 30a is rectangular. However, the shape of opening 30a is not particularly limited. For example, opening 30a may have a rounded corner. Alternatively, the shape of opening 30a may be hexagonal, circular, or the like, for example.

Moreover, only one opening 30a may be provided. In this case, opening 30a has to be closed in order to prevent electric separation between the p type region inwardly of opening 30a and the p type region outwardly of opening 30a.

Moreover, in the above-mentioned embodiment, the MOSFET has been illustrated as a transistor provided in the silicon carbide semiconductor device. However, the transistor element provided in the silicon carbide semiconductor device according to the present embodiment may be any transistor element having a drift layer and a body region. For example, the transistor element may be an IGBT (Insulated Gate Bipolar Transistor) or the like.

Moreover, in the above-mentioned embodiment, silicon carbide layer 10 has $n^+$ substrate 11 and n type drift layer 12. Silicon carbide layer 10 is an n type silicon carbide layer as a whole. In other words, in the above-mentioned embodiment, the first conductivity type, which is the conductivity type of silicon carbide layer 10, is n type, whereas the second conductivity type, which is the conductivity type of each of body region 13a and JTE region 21, is p type. By forming the p type region in the n type silicon carbide layer, the silicon carbide semiconductor device can be facilitated to be manufactured. However, the first conductivity type may be p type, and the second conductivity type may be n type.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST 1, 1A, 1B: silicon carbide semiconductor device; 2, 2A: region; 5: positive electrode terminal; 6: negative electrode terminal; 7: transistor element; 8: direct current power supply; 9A: single-phase load; 10: silicon carbide layer; 10a: first main surface (silicon carbide layer); 10b: second main surface (silicon carbide layer); 11: $n^+$ substrate; 12: drift layer; 13a, 13b: body region; 14: source region; 15: insulating film; 15a: gate insulating film; 16: source electrode; 18: $p^+$ region; 20: drain electrode; 21: JTE region; 22: guard ring region; 25: Schottky electrode; 25a: end portion (Schottky electrode); 27: gate electrode; 30: opening region; 30a: opening; 40: depletion layer; 50: backside surface protecting electrode; 59: gate pad electrode; 65: source pad electrode; 66: gate runner; 70: interlayer insulating film; 101: inverter circuit; BT: bottom surface; CH: channel region; CL: element region; D1: Schottky barrier diode; M1: MOS transistor; SW: side wall surface; TM: termination region; a1: distance.

The invention claimed is:

1. A silicon carbide semiconductor device comprising:
a silicon carbide layer having a first main surface and a second main surface opposite to the first main surface, the silicon carbide layer including
a drift layer having first conductivity type and defining the first main surface of the silicon carbide layer,
a first region provided in the drift layer, the first region having second conductivity type different from the first conductivity type, the first region defining an outer circumference portion of an element region in which a transistor element is provided, and
a second region provided external to the first region in the drift layer, the second region having the second conductivity type, the second region being electrically connected to the first region,
the first region being provided with at least one opening through which the drift layer is exposed; and
a Schottky electrode provided in the opening and forming a Schottky junction with the drift layer, wherein
the opening is a trench extending to the drift layer through the first region, and
the Schottky electrode is provided to cover an inner circumferential surface of the trench.

2. The silicon carbide semiconductor device according to claim 1, wherein the Schottky electrode forms a Schottky junction with both the drift layer and the first region.

3. The silicon carbide semiconductor device according to claim 1, further comprising:
a third region provided in the first region and having the first conductivity type;
a fourth region provided in the first region and having the second conductivity type; and a pad electrode electrically connected to the third region, the fourth region, and the Schottky electrode.

4. The silicon carbide semiconductor device according to claim 1, wherein the at least one opening is a plurality of openings separated from each other by spaces, and the plurality of openings are provided along the outer circumference portion in the element region.

5. The silicon carbide semiconductor device according to claim 4, wherein the spaces between the plurality of openings have a constant length.

6. The silicon carbide semiconductor device according to claim 1, further comprising a guard ring region having the second conductivity type, the guard ring region being provided in the drift layer to surround the first and second regions when viewed in a plan view.

7. The silicon carbide semiconductor device according to claim 1, wherein the first conductivity type is n type, and the second conductivity type is p type.

* * * * *